US010136542B2

(12) United States Patent
Gurr et al.

(10) Patent No.: US 10,136,542 B2
(45) Date of Patent: Nov. 20, 2018

(54) ELECTROMECHANICAL FUNCTION UNIT FOR A BATTERY-OPERATED, HANDHELD WORK APPARATUS

(71) Applicant: Andreas Stihl AG & Co. KG, Waiblingen (DE)

(72) Inventors: Kay-Steffen Gurr, Heilbronn (DE); Joachim Kolb, Ludwigsburg (DE); Gernot Liebhard, Waiblingen (DE); Matthias Mueller, Schorndorf (DE)

(73) Assignee: Andreas Stihl AG & Co. KG, Waiblingen (DE)

( * ) Notice: Subject to any disclaimer, the term of this patent is extended or adjusted under 35 U.S.C. 154(b) by 0 days.

(21) Appl. No.: 15/461,224

(22) Filed: Mar. 16, 2017

(65) Prior Publication Data

US 2017/0273209 A1    Sep. 21, 2017

(30) Foreign Application Priority Data

Mar. 16, 2016   (DE) .................. 10 2016 003 151

(51) Int. Cl.
*H05K 3/36*       (2006.01)
*H05K 7/14*       (2006.01)
(Continued)

(52) U.S. Cl.
CPC ............ *H05K 7/1427* (2013.01); *B25F 5/00* (2013.01); *B25F 5/02* (2013.01); *H01R 12/57* (2013.01); *H02P 3/06* (2013.01); *H05K 5/0247* (2013.01)

(58) Field of Classification Search
CPC .......... H05K 3/36; H05K 7/14; H05K 7/1427; H05K 13/0007; H05K 13/0447;
(Continued)

(56) References Cited

U.S. PATENT DOCUMENTS 6,938,733 B2    9/2005  Eilinger
7,679,300 B2 *  3/2010  Miyaura ............... H01H 9/061
                                                         318/268

(Continued)

FOREIGN PATENT DOCUMENTS

DE          10352653 A1    7/2004
EP           1791246 A2    5/2007
(Continued)

*Primary Examiner* — Bickey Dhakal
(74) *Attorney, Agent, or Firm* — Walter Ottesen, P.A.

(57) ABSTRACT

An electromechanical function unit is for a battery operated, handheld work apparatus that has an operating switch for putting the work apparatus into operation. The operating switch is to be actuated by an actuating element of the work apparatus. The operating switch is connected to a control unit for operating the work apparatus. The control unit includes a circuit board having electronic components, and has a first circuit board side, and a second circuit board side that faces away from the first circuit board side. In order to avoid wiring and to reduce the tolerance chain, provision is made to dispose the operating switch on the second circuit board side. The operating switch is supported statically via a support arrangement, independently of the circuit board. The support arrangement has no mechanical connection to the circuit board, and leads from the second circuit board side to the first circuit board side.

12 Claims, 5 Drawing Sheets

(51) Int. Cl.
  *B25F 5/02* (2006.01)
  *H01R 12/57* (2011.01)
  *H02P 3/06* (2006.01)
  *H05K 5/02* (2006.01)
  *B25F 5/00* (2006.01)

(58) Field of Classification Search
  CPC ... H02K 7/145; H02P 3/06; H02P 3/12; H02P 29/04
  See application file for complete search history.

(56) References Cited

U.S. PATENT DOCUMENTS

2012/0292063 A1* 11/2012 Forster .................. B25F 5/00
                                                 173/18
2015/0174750 A1   6/2015 Hosking
2015/0279592 A1* 10/2015 Ekstrom ................ H01H 21/12
                                                 200/522

FOREIGN PATENT DOCUMENTS

| EP | 2524773 | A2 | 11/2012 |
| EP | 2929986 | A2 | 10/2015 |
| WO | 9211679 | A1 | 7/1992 |

* cited by examiner

ELECTROMECHANICAL FUNCTION UNIT FOR A BATTERY-OPERATED, HANDHELD WORK APPARATUS

CROSS REFERENCE TO RELATED APPLICATION

This application claims priority of German patent application no. 10 2016 003 151.4, filed Mar. 16, 2016, the entire content of which is incorporated herein by reference.

FIELD OF THE INVENTION

The invention relates to an electromechanical function unit for a battery operated, handheld work apparatus that has an operating switch for putting the work apparatus into operation. The operating switch is to be actuated by an actuating element, wherein the work appliance is put into operation via a control unit when the operating switch has been closed. The control unit includes a circuit board having electronic components, the circuit board of the control unit having a first circuit board side, and a second circuit board side that faces away from the first circuit board side.

BACKGROUND OF THE INVENTION

Electrical work apparatuses, in particular battery operated work apparatuses such as hedge trimmers, chain saws, brushcutters, blower apparatuses or the like require an operating switch, realized as an electrical switch, for putting the work apparatus into operation. This electrical switch is usually disposed close to an actuating element of the work apparatus, to enable the switch-on point of the switch to be easily matched to the actuation stroke of the actuating element.

An operating switch disposed close to an actuating element of the work apparatus necessitates an electrical wiring to the battery pack and the control unit. The termination of the wiring is usually effected via cable lugs, which, owing to loosening, oxidation or suchlike influences, can constitute fault sources.

If the operating switch is disposed with a greater spacing in relation to an actuating element, then lever arrangements or suchlike operative connections are necessary for the mechanical actuation of the operating switch. In this case, it must be ensured that the necessarily existing tolerance chain be kept small, in order that a predefined stroke position of the actuating element is assigned to a reproducible switch-on point of the operating switch.

SUMMARY OF THE INVENTION

It is an object of the invention to provide an electromechanical function unit for a battery operated, handheld work apparatus that, on the one hand, requires only a small amount of wiring in the work apparatus and, on the other hand, enables the switch-on point of the operating switch to be matched with precision to an actuating element.

The function unit of the invention is for a battery operated, handheld work apparatus. The function unit includes: an operating switch; an actuating member configured to actuate the operating switch; a control unit for operating the work apparatus; the control unit having a circuit board including electronic components; the circuit board having a first circuit board side and a second circuit board side facing away from the first circuit board side; the operating switch being arranged on the second circuit board side; a support arrangement; the operating switch being statically supported by the support arrangement independently of the circuit board; and, the support arrangement leading, without a mechanical connection to the circuit board, from the second circuit board side to the first circuit board side.

If the operating switch is disposed directly on the circuit-board of the control unit, the amount of wiring can be reduced, and connections via cable lugs can be avoided. The operating switch, soldered-in on a second circuit board side, is supported statically via a support arrangement, independently of the circuit board, the support arrangement leading, without a mechanical connection to the circuit board, from the second circuit board side to the first circuit board side. The position of the operating switch is thus not determined by its position on the circuit board itself, but solely by the support arrangement. The mounting position of the operating switch on the circuit board of the control unit may be imprecise; the position of the circuit board in the work apparatus itself may also be incorrect. Since the operating switch is supported, so as to be solid with the housing, via a support arrangement that is independent of the circuit board, a position of the operating switch on the circuit board that is subject to tolerances is not part of the tolerance chain, any more than an incorrect position of the circuit board in the housing of the work apparatus.

Advantageously, the support arrangement is realized in such a manner that it projects through a passthrough opening in the circuit board. This enables the circuit board to be released from the support arrangement, such that interactions between the support arrangement and the circuit board are avoided.

Advantageously, the circuit board is held in a receiving trough, wherein the first circuit board side faces toward the receiving trough. The support arrangement is configured in such a manner that it supports the operating switch against the receiving trough, in particular against the base of the receiving trough.

When the circuit board has been positioned in the receiving trough and the operating switch is bearing against the support arrangement, the circuit board is fixed, in particular encapsulated in potting compound, in the receiving trough. Partial encapsulation in potting compound may be as expedient as all-over encapsulation of the circuit board in potting compound.

On the first circuit board side, the circuit board carries electrical contacts for electrical connection to a battery pack. The contacts project through the base of the receiving trough.

The support arrangement is constituted, expediently, by a support dome, and by a support bearing seated on the support dome. It may be advantageous in this case if the support bearing overlaps an end of the support dome which faces the support bearing.

In an embodiment of the invention, the operating switch of the function unit is mounted with an assembly module on the second circuit board side. The support bearing is realized on the assembly module, and engages in a passthrough opening in the circuit board. Owing to radial play, it is ensured that the support bearing has no mechanical connection to the circuit board, such that the support dome engaging in the support bearing has no contact with the circuit board.

The support dome is advantageously provided in the receiving trough of the circuit board, expediently fabricated so as to constitute a single piece with the receiving trough. Preferably, the receiving trough is an injection-molded part made of plastic.

In a particular configuration of the invention, all electrical connections between the battery pack, the control unit and the operating switch are realized as conductor paths on the circuit board of the control unit. There is thus no need for an otherwise necessary wiring with cable lugs. Fault sources can be reduced.

The function unit may additionally have an electrical brake circuit for an electric motor, wherein the brake circuit includes a brake resistor, and an electrical brake switch that is disposed on the second circuit board side, in particular in an assembly module. The operating switch and the brake switch are expediently disposed in a common assembly module, resulting in a mechanically solid, loadable arrangement of the switches on the circuit board of the control unit. An assembly module is expedient, in particular, if the circuit board, with the components disposed thereon, is to be encapsulated in potting compound. The assembly module can protect the operating switch against ingress of potting compound.

In order to reduce the wiring to a minimum for the brake circuit also, it is provided to realize the brake circuit as a conductor path on the circuit board of the control unit. Preferably, the brake resistor is also provided as a conductor path on the circuit board.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
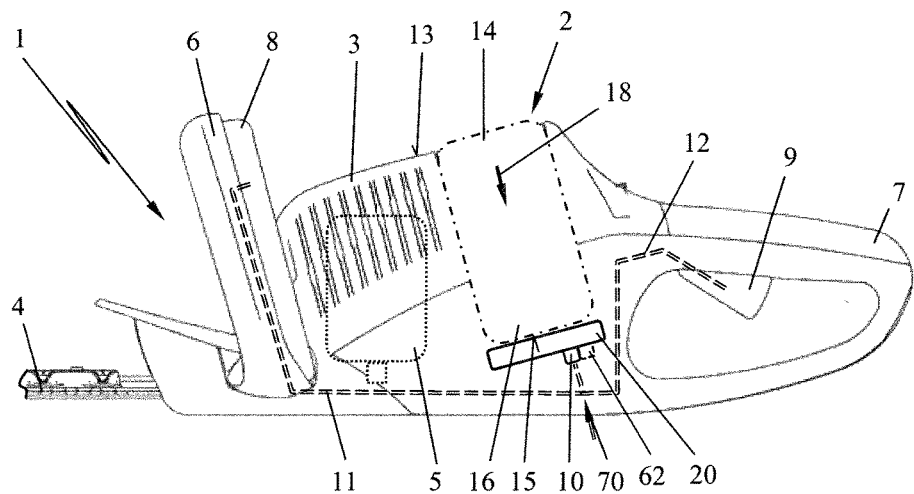
FIG. 1 shows a portable, electrical work apparatus having a battery pack in a schematic side view.

Shown schematically in FIG. 1 is a portable, handheld work apparatus 1, which, by way of example, is a hedge trimmer. The represented work apparatus may also be realized as a battery operated blower apparatus, battery operated brushcutter, battery operated hedge trimmer, or suchlike battery operated work apparatus.

The battery operated electrical work apparatus 1 represented in the embodiment has a battery pack 2, which is inserted, in the arrow direction 18, in a receptacle of the housing 3 of the work apparatus 1. A work tool 4 of the work apparatus 1 is driven by an electric motor 5, which is disposed inside the housing 3 and represented by a broken line.

The battery operated work apparatus 1 has a front handle 6 and a rear handle 7. In the embodiment shown, provided in the rear handle 7 there is an actuating element 9 for an operating switch 10, which is held on a function module 20. A further actuating element 8, which advantageously likewise acts on the operating switch 10, may be provided in the front handle 6. Expediently, the actuating elements 8 and 9 act on the operating switch 10 according to the principle of a so-called two-hand circuit; the operative connections 11 and 12 between the actuating elements 8 and 9 and the operating switch 10 are represented schematically, by broken lines, in FIG. 1. If the actuating element 9 and/or the actuating element 8 are/is depressed, the operative connections 11 and 12 exert a stroke, in the arrow direction 70, on the operating switch 10, for the purpose of switching on the operating switch 10, as represented in FIG. 1.

As also shown by FIG. 1, a first end 16 of the battery pack 2 is located inside the housing 3, while the other, second, end 14 of the battery pack 2 is located approximately level with the topside 13 of the housing.

The inserted battery pack 2, in particular the first end 16 of the battery pack 2, has a contact end 15, which lies facing toward the function module 20. The function module 20 is held in the housing 3, and has power contacts 21 and 22 (FIG. 2), which serve for electrical power connection to the battery pack 2. Assigned to the electrical power contacts 21 and 22 there are contact sockets 23 and 24, in the facing end 16 of the battery pack 2.

Figure 2:
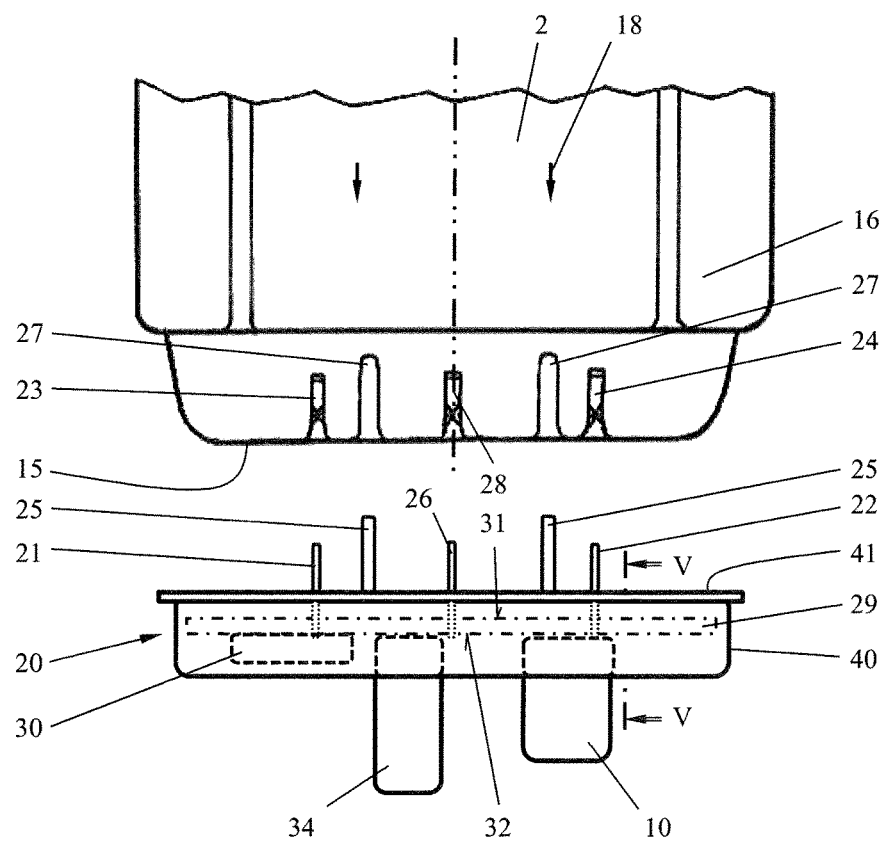
FIG. 2 is a schematic of an electromechanical function module for contacting to the battery pack according to FIG. 1.

The function module 20 additionally has positioning elements 25, assigned to which there are positioning receptacles 27, in the end 16 of the battery pack 2. In addition, there is at least one communication contact 26 provided on the function module 20; opposite the communication contact 26, there is a corresponding contact socket 28 in the contact side 15 of the battery pack 2. Together with the contact sockets 23, 24, the power contacts 21, 22 constitute a plug-in connection, as does the communication contact 26 with the contact socket 28 assigned thereto. Upon insertion of the battery pack 2 in the apparatus shaft of the housing 3, in the arrow direction 18, on the one hand the electrical power contacts 21, 22 are inserted in the contact sockets 23, 24 and, on the other hand, the communication contact 26 is inserted in the contact socket 28. The positioning elements 25, to which the positioning receivers 27 are assigned, are provided to securely align the contact sockets 23, 24, 28 in relation to the power contacts 21, 22 and the communication contact 26. As shown by FIG. 2, the positioning elements 25 are longer than the power contacts 21, 22, or the communication contact 26, such that the positioning elements 25 are the first to engage with the contact side 15 of the battery pack 2.

As represented schematically in FIG. 2, the function module 20 includes a control unit 30, via which the electric motor 5 is put into operation. The control unit 30 is disposed on a circuit board 29 that, in the embodiment shown, is preferably located in a receiving trough 40. The circuit board 29 has a first circuit board side 31 and a second circuit board side 32.

Figure 3:
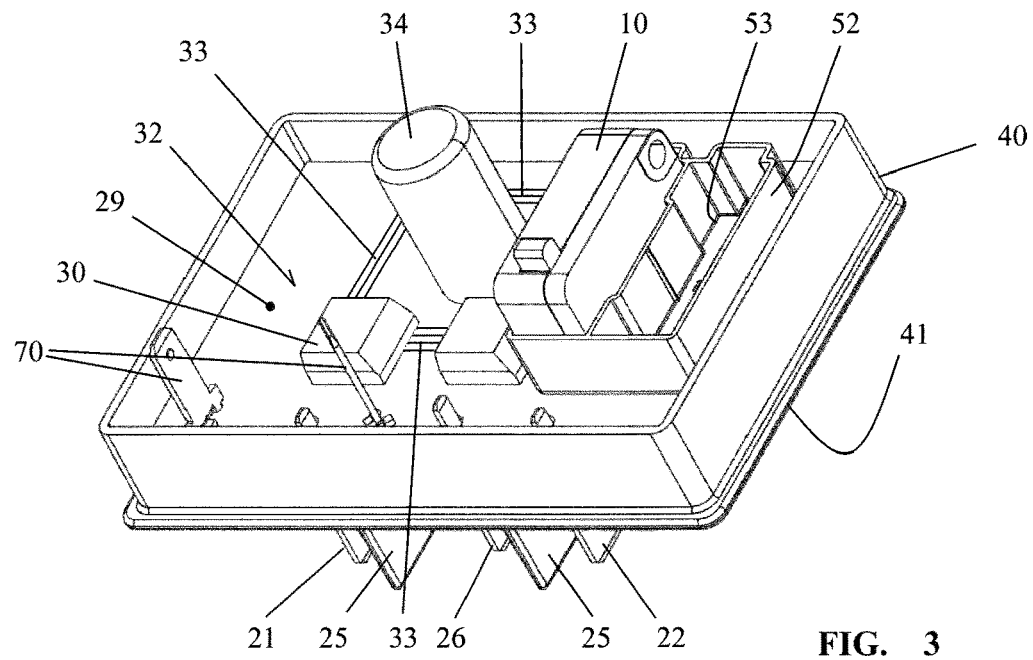
FIG. 3 shows a perspective view of a circuit board side of the function module with an operating switch.
Figure 5:
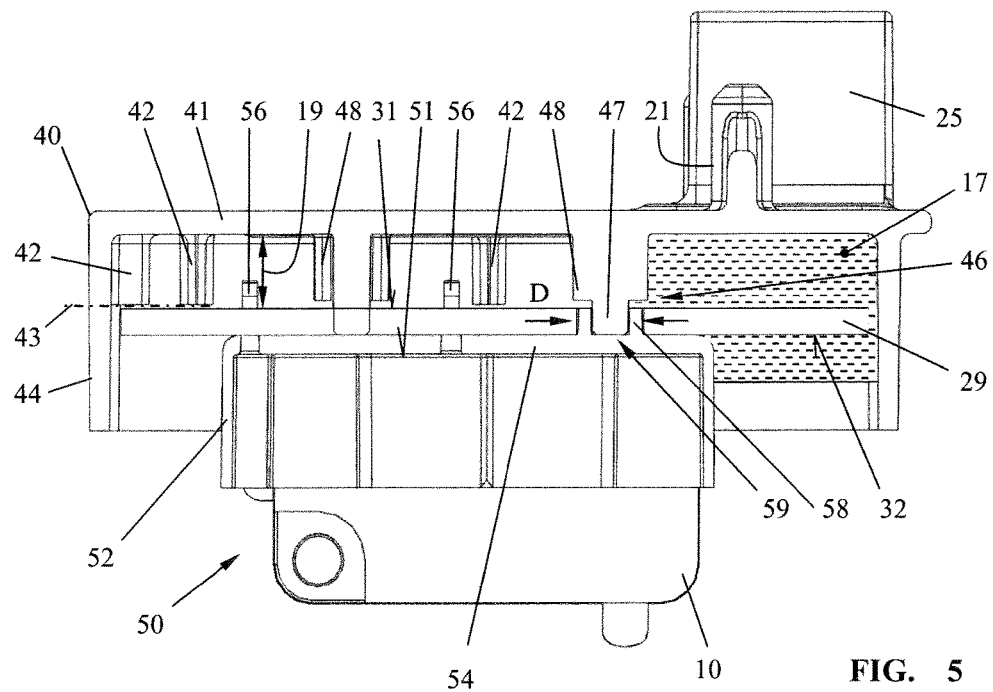
FIG. 5 shows a section through the function module, along the line V-V in FIG. 2.

Disposed on the second circuit board side 32, as shown by FIGS. 2, 3 and 5, are the operating switch 10, the control unit 30 and flat contacts 70 for connection of the electric motor 5. In addition, further electrotechnical components 34, for example capacitors, resistors, transistors and the like, are provided on the second circuit board side.

The first circuit board side 31 of the circuit board 29 carries the power contacts 21, 22 and the communication contact 26, as shown by FIG. 2. The power contacts 21 and the communication contact 26 serve to electrically connect the function module 20 to the battery pack 2. If the circuit board 29 is disposed in a receiving trough 40, as represented in FIGS. 2 to 5, the power contacts 21, 22 and the communication contact 26 project through the base 41 of the receiving trough 40. The circuit board 29 is located with its first circuit board side facing toward the base 41 of the receiving trough 40. The circuit board 29 has a spacing 19—cf. FIGS. 5 and 8—in relation to the base 41 of the receiving trough 40.

A particular advantage of the invention is that the wiring of the function module 20 is realized without a wiring with individual, separate connecting leads; the electrical connections between the control unit 30, the electrical power contacts 21, 22, the communication contact 26 and the operating switch 10 for switching on and off the electric motor 5 are realized as conductor paths 33 on the circuit board 29 (FIG. 3). The power contacts 21, 22, the communication contact 26, the control unit 30 and the operating switch 10 are soldered-in on the circuit board 29.

Figure 4:
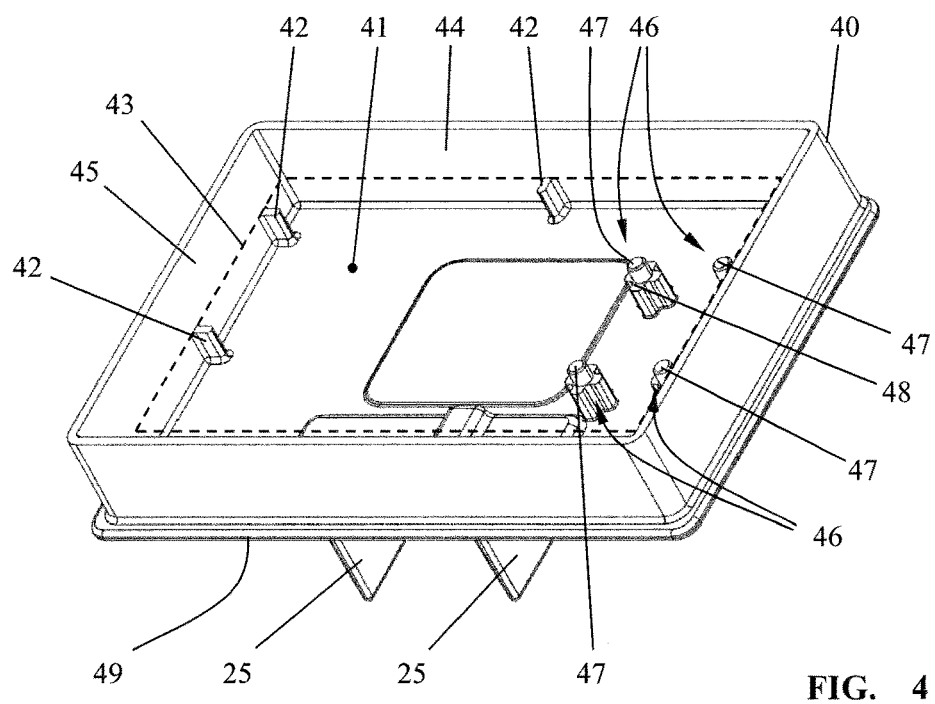
FIG. 4 shows a receiving trough for receiving a circuit board as represented in FIG. 3.

The receiving trough 40 represented in FIG. 4 is made, advantageously, of plastic, and has support elements 42, which project from the base 41 of the receiving trough 40 to a support plane 43. The support elements 42 are preferably held on the side walls 44, 45 of the receiving trough 40 and, as a corner element between the base 41 and the side walls 44, 45, reinforce the structure of the receiving trough 40.

The base 41 additionally carries support arrangements 46. A support dome 47 may be realized on a support arrangement 46. Further support elements 48 for the circuit board 29 may be provided on the support arrangement 46, around the support dome 47. The further support elements 48 preferably terminate at the support plane 43.

In the embodiment according to FIG. 4, four support arrangements 46 in total are provided.

The outer positioning elements 25 are made of plastic, and are attached, in particular integrally formed-on, in the receiving trough 40, on the outer side 49 of the base 41 that faces toward the battery pack 2.

As shown by FIG. 5, the circuit board 29 is located with the first circuit board side 31 facing toward the base 41 of the receiving trough 40. Advantageously, the circuit board 29 is supported, in the support plane 43, on the support elements 42 and 48.

The support arrangement 46 is disposed between the base 41 of the receiving trough 40 and the operating switch 10, as a result of which the operating switch 10 is supported statically via the support arrangement 46, independently of the circuit board 29. The support arrangement 46 leads, without mechanical connection to the circuit board 29, from the first circuit board side 31 to the second circuit board side 32. It is provided in this case that the support arrangement 46 projects through, in particular projects freely through, a passthrough opening D in the circuit board 29.

The support dome 47 of the support arrangement 46 lies against the base 51 of the operating switch 10 realized as a microswitch 50, and supports the latter directly against the receiving trough 40. Irrespective of the relative position of the operating switch 10 in relation to the circuit board 29, and the relative position of the circuit board 29 in relation to the supports of the support elements 42 and 48, the operating switch 10 lies on the free end of the support dome 47, thereby reducing the tolerance chain.

Figure 6:
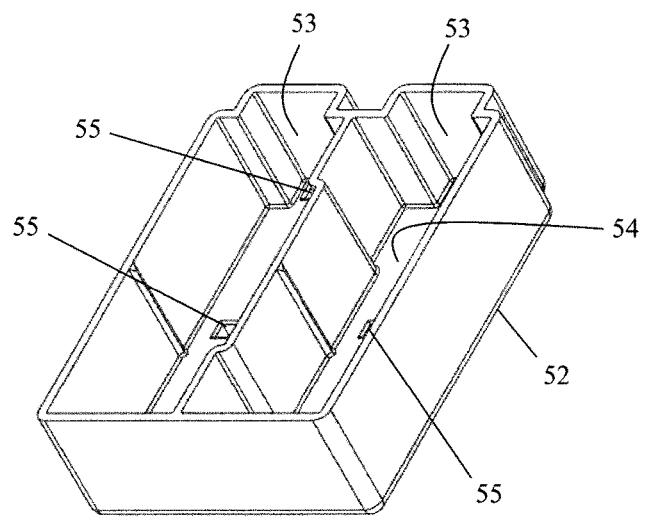
FIG. 6 is a perspective representation of an assembly module for mounting an operating switch and/or a brake switch.
Figure 7:
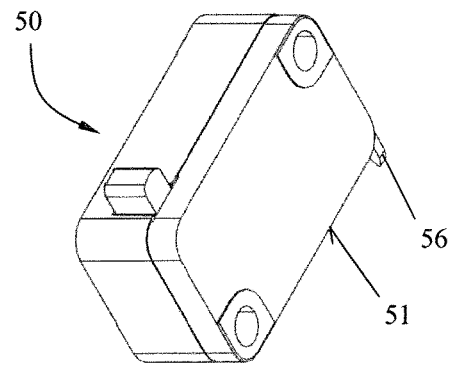
FIG. 7 shows a perspective view of an operating switch realized as a microswitch.

Advantageously, the electrical operating switch 10 realized as a microswitch 50 is held in an assembly module 52, which—in a configuration for two microswitches—is represented in FIG. 6. The assembly module 52 is realized in the manner of a housing trough, and is divided into two receptacles 53, for two microswitches 50. The base 54 of the assembly module 52 has passthrough openings 55 for connecting pins 56 (FIG. 7) of the microswitch 50. The assembly module 52 is configured, in particular, to protect the microswitch 50, and can prevent potting compound 17 from entering the housing of the microswitch 50. The assembly module 52 also ensures that the microswitch 50 can be mounted on the circuit board 29 in a mechanically loadable manner.

Contactless switches, such as reed contacts, Hall sensors or suchlike proximity switches may also be used as an operating switch 10 hand/or brake switch 62.

Figure 8:
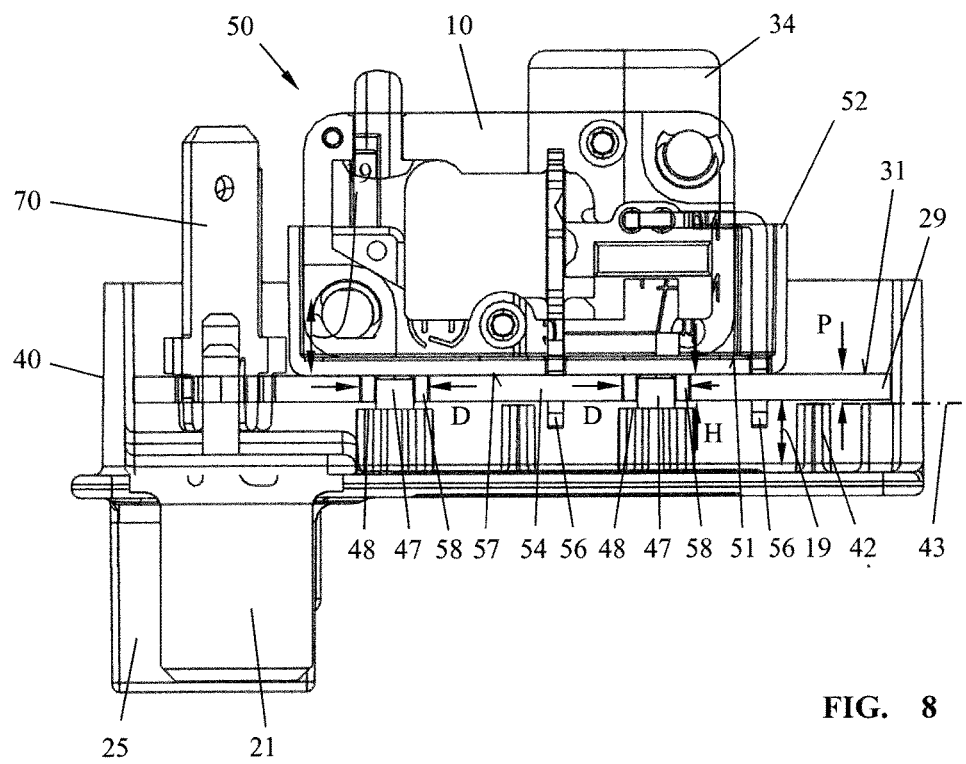
FIG. 8 shows a section through the function module, at the level of the operating switch; and, FIG. 9 shows a perspective view of the second circuit board side of the function module, with an operating switch and a brake switch.
Figure 9:
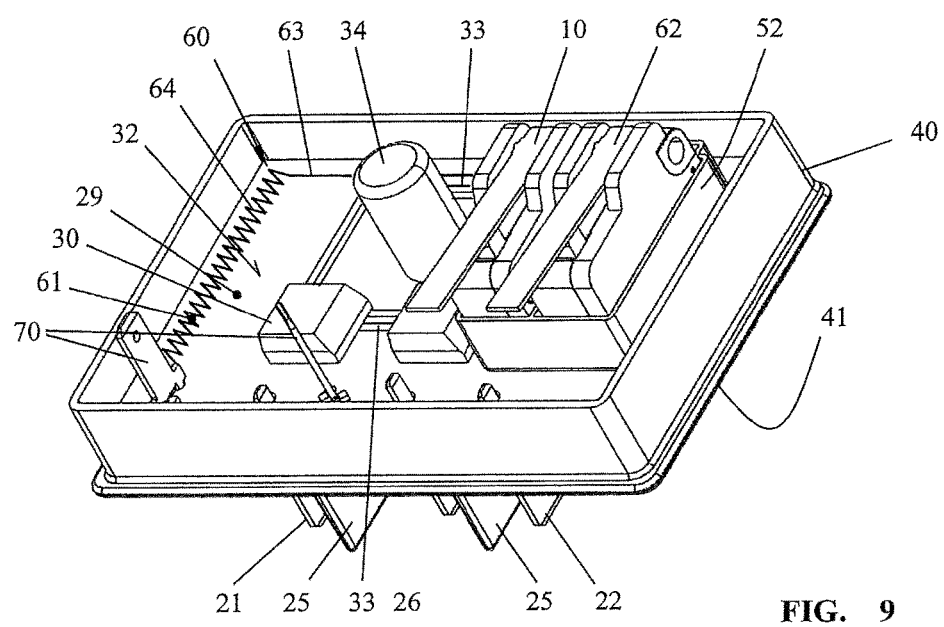

For the purpose of mounting the microswitch 50 on the circuit board 29, the microswitch 50 is inserted in a receptacle 53 of the assembly module 52, the connecting pins 56 projecting through the passthrough openings 55 in the base 54 of the assembly module 52. As shown by FIG. 8 in particular, the base 51 of the microswitch 50 lies on the base 54 of the assembly module 52. In this position, the assembly module 52 is placed onto the circuit board 29. The connecting pins 56 in this case project through solder pads of the circuit board 29, and are soldered-on on the circuit board 29.

As shown by FIGS. 5 and 8, on the flat side 57 that faces toward the circuit board 29, the base 54 of the assembly module 52 carries cylinder supports 58, which project into assigned passthrough openings D in the circuit board 29. Advantageously, the axial height H of a cylinder support 58 corresponds approximately to the thickness P of the circuit board 29. The cylinder support 58 lies—preferably with little radial play—in the passthrough opening D in the circuit board 29. A cylinder support 58 constitutes a support bearing 59 of the assembly module 52 that acts in combination with the support arrangement 46. The support bearing 59 overlaps the facing free end of the support dome 47 of the support arrangement 46, thereby also achieving alignment and fixing of the operating switch 10 in the support plane 43. The cylinder supports 58 engaging in the passthrough openings D in the circuit board 29 also determine the positionally exact position of the operating switch 10 on the circuit board 29 itself.

The microswitch 50, for example of the operating switch 10, is supported, together with the assembly module 52, via the support arrangement 46, on the base 41 of the receiving trough 40. Since the receiving trough 40 is held in the housing 3 of the work apparatus 1, the microswitch 50 is supported directly on the housing 3. Owing to the short tolerance chain that is thus achieved, it is ensured that the switch-on point of the operating switch 10 upon depression of one or both actuating elements 8, 9 can be matched with precision to the actuating stroke of the actuating elements 8, 9. Precise setting of the switch-on point can thus be ensured.

In an embodiment of the invention, there is an electrical brake circuit 60 assigned to the electric motor 5 that is to be controlled via the function module 20, the brake circuit 60 having a brake resistor 61, which is preferably disposed on the circuit board 29 of the control unit 30. A brake switch 62 assigned to the brake circuit 60 is disposed in the free receptacle 53 of the assembly module 52, closely adjacent to the operating switch 10, on the second circuit board side 32. The realization of a common assembly module 52 for the operating switch 10 and the brake switch 62 ensures positionally precise mounting of the microswitches 50 constituting the operating switch 10 and the brake switch 62. In order to avoid the use of connecting leads that have to be laid separately, it is provided, in particular, to realize the electrical brake circuit 60 as a conductor path 63 on the circuit board 29. Expediently, the brake resistor 61 is also realized as a conductor path 64 on the circuit board 29.

After the equipped circuit board 29 has been positioned in the receiving trough 40, and the operating switch 10 has been firmly pressed onto the support arrangement 46, the circuit board 29 is encapsulated in potting compound in the receiving trough 40. The potting compound 17 is indicated in a schematic representation in FIG. 5. Advantageously, the circuit board 29 is encapsulated all over, that is covered with potting compound 17 on both flat sides 31, 32. It may be expedient for the potting compound 17 to be provided only partially.

It is understood that the foregoing description is that of the preferred embodiments of the invention and that various changes and modifications may be made thereto without departing from the spirit and scope of the invention as defined in the appended claims.

What is claimed is:

1. A function unit for a battery operated, handheld work apparatus, the function unit comprising:
an operating switch for operating the work apparatus;
an actuating member configured to actuate said operating switch;
a circuit board having a plurality of electronic components arranged thereon;
said circuit board having a control unit mounted thereon for operating said work apparatus;
said circuit board having a first circuit board side and a second circuit board side facing away from said first circuit board side;
a housing defining a housing-fixed wall;
said first circuit board side facing toward said housing-fixed wall;
said operating switch being arranged at said second circuit board side;
a mechanical support arrangement connected to said housing-fixed wall and being independent of said circuit board;
said operating switch being statically supported by said support arrangement independently of said circuit board;
said support arrangement projecting from said housing and, without a mechanical connection to said circuit board, from said second circuit board passing side to said first circuit board side; and,
said circuit board having a passthrough opening formed therein to accommodate the passing of said support arrangement therethrough so as to cause said support arrangement to mechanically brace said operating switch against said housing-fixed wall.

2. The function unit of claim 1 further comprising:
a receiving trough;
said circuit board being held in said receiving trough;
said first circuit board side facing said receiving trough; and,
said support arrangement supporting said operating switch with respect to said receiving trough.

3. The function unit of claim 2, wherein said circuit board is potted in said receiving trough.

4. The function unit of claim 2, wherein:
said receiving trough has a base;
said circuit board, on said first circuit board side, has electrical contacts configured for an electrical connection to a battery pack; and,
said electrical contacts project through said base of said receiving trough.

5. The function unit of claim 1, wherein all electrical connections between a battery pack, the control unit and the operating switch are formed as conducting paths on said circuit board of said control unit.

6. The function unit of claim 1, wherein:
the work apparatus includes an electric motor having an electrical braking circuit;
said braking circuit includes a braking resistor and an electric braking switch; and,
said braking switch is arranged on said second circuit board side in a mounting module.

7. The function unit of claim 6, wherein said braking switch is arranged in said mounting module.

8. The function unit of claim 7, wherein said electrical braking circuit is formed as a conductor path on said circuit board of said control unit.

9. A function unit for a battery operated, handheld work apparatus, the function unit comprising:
an operating switch for operating the work apparatus;
an actuating member configured to actuate said operating switch;
a circuit board having a plurality of electronic components arranged thereon;
said circuit board having a control unit mounted thereon for operating said work apparatus;
said circuit board having a first circuit board side and a second circuit board side facing away from said first circuit board side;
said operating switch being mounted on said second circuit board side;
a support arrangement statically bracing said operating switch independently of said circuit board;
said support arrangement leading through from said second circuit board side to said first circuit board side without a mechanical connection to said circuit board; and,
said support arrangement being formed by a support dome and a support bearing seated on said support dome.

10. The function unit of claim 9, wherein:
said support dome has a first dome end facing said support bearing; and,
said support bearing overlaps said first dome end.

11. The function unit of claim 9, wherein:
said operating switch is mounted on said second circuit board side with a mounting module;
said circuit board defines a passthrough opening; and,
said support bearing is formed on said mounting module and projects through said passthrough opening.

12. The function unit of claim 9 further comprising:
a receiving trough for said circuit board; and,
said support dome being formed on said receiving trough.

* * * * *

UNITED STATES PATENT AND TRADEMARK OFFICE
CERTIFICATE OF CORRECTION

PATENT NO. : 10,136,542 B2
APPLICATION NO. : 15/461224
DATED : November 20, 2018
INVENTOR(S) : Gurr et al.

It is certified that error appears in the above-identified patent and that said Letters Patent is hereby corrected as shown below:

In the Claims

In Column 7:
At Claim 1, Line 44: delete "from said second circuit board passing side" and substitute -- passing from said second circuit board side -- therefor.

Signed and Sealed this
Twenty-third Day of April, 2019

Andrei Iancu
*Director of the United States Patent and Trademark Office*